(12) United States Patent
Chiu et al.

(10) Patent No.: US 10,826,474 B2
(45) Date of Patent: Nov. 3, 2020

(54) CLOCK GENERATION CIRCUIT AND CLOCK ADJUSTMENT METHOD THEREOF

(71) Applicant: Nuvoton Technology Corporation, Hsinchu (TW)

(72) Inventors: Ta-Chin Chiu, Hsinchu (TW); Chieh-Sheng Tu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 16/661,953

(22) Filed: Oct. 23, 2019

(65) Prior Publication Data

US 2020/0136597 A1    Apr. 30, 2020

(30) Foreign Application Priority Data

Oct. 25, 2018   (TW) ............... 107137809 A

(51) Int. Cl.
| | |
|---|---|
| H03K 3/00 | (2006.01) |
| H03K 5/135 | (2006.01) |
| H03K 3/03 | (2006.01) |
| H03K 7/08 | (2006.01) |
| H04L 7/00 | (2006.01) |

(52) U.S. Cl.
CPC ........... *H03K 5/135* (2013.01); *H03K 3/0315* (2013.01); *H03K 7/08* (2013.01); *H04L 7/0016* (2013.01)

(58) Field of Classification Search
CPC ........ H03K 5/135; H03K 3/0315; H03K 7/08; H04L 7/0016
USPC ........................................... 327/291
See application file for complete search history.

(56) References Cited

U.S. PATENT DOCUMENTS

| | | | |
|---|---|---|---|
| 6,798,299 B1 * | 9/2004 | Mar ..................... | G06F 1/04 331/111 |
| 7,154,342 B2 * | 12/2006 | Munker ................ | H03K 21/12 331/11 |
| 7,746,181 B1 * | 6/2010 | Moyal ................... | H03L 1/00 331/11 |
| 7,994,866 B2 | 8/2011 | Fievet et al. | |
| 8,085,099 B2 * | 12/2011 | Pancholi ............... | H03L 7/089 331/17 |
| 8,669,817 B2 | 3/2014 | Pancholi et al. | |
| | | (Continued) | |

FOREIGN PATENT DOCUMENTS

| | | |
|---|---|---|
| TW | 406219 | 9/2000 |
| TW | 201515393 | 4/2015 |
| | (Continued) | |

*Primary Examiner* — Ryan Jager
(74) *Attorney, Agent, or Firm* — JCIPRNET

(57) ABSTRACT

A clock generation circuit and a clock adjustment method thereof are provided. The clock generation circuit includes a fixed clock source, a variable clock source, a timing adjustment circuit, and a pulse width signal generator. The fixed clock source generates a reference clock signal having a fixed frequency. The variable clock source receives a frequency setting signal to correspondingly generate an operational clock signal having a variable frequency. The timing adjustment circuit determines whether a frequency of the operation clock signal is N times of a target frequency according to the reference clock signal to set a frequency of the operation clock signal. The pulse width signal generator divides the operating clock signal to generate a pulse width modulation signal having the target frequency.

18 Claims, 2 Drawing Sheets

(56) References Cited

U.S. PATENT DOCUMENTS

| | | | | |
|---|---|---|---|---|
| 8,755,479 B2* | 6/2014 | Vavelidis | H03L 7/1974 | |
| | | | 375/295 | |
| 9,325,276 B2* | 4/2016 | Huynh | H03B 5/04 | |
| 9,455,854 B2* | 9/2016 | Gao | H04B 1/16 | |
| 9,755,575 B1* | 9/2017 | Wang | H03B 5/24 | |
| 2009/0153252 A1* | 6/2009 | Chen | H03L 7/113 | |
| | | | 331/10 | |
| 2009/0316847 A1* | 12/2009 | Thomsen | H03L 7/085 | |
| | | | 375/373 | |
| 2011/0084768 A1* | 4/2011 | Hammond | H03L 7/1806 | |
| | | | 331/18 | |
| 2011/0199046 A1 | 8/2011 | Tsai et al. | | |
| 2018/0091161 A1* | 3/2018 | Chou | H03L 7/18 | |

FOREIGN PATENT DOCUMENTS

| | | |
|---|---|---|
| TW | I522772 | 2/2016 |
| TW | 201717545 | 5/2017 |
| TW | 201810931 | 3/2018 |

* cited by examiner

CLOCK GENERATION CIRCUIT AND CLOCK ADJUSTMENT METHOD THEREOF

CROSS-REFERENCE TO RELATED APPLICATION

This application claims the priority benefit of Taiwan application serial no. 107137809, filed on Oct. 25, 2018. The entirety of the above-mentioned patent application is hereby incorporated by reference herein and made a part of this specification.

BACKGROUND

Technical Field

The disclosure relates to a clock generation circuit, and more particularly to a clock generation circuit and a clock adjustment method thereof.

Description of Related Art

In an electronic device, any wireless interface requires an accurate operational clock signal, but a stable clock source (e.g., a quartz oscillator) usually has a higher frequency and a lower frequency adjustability. Alternatively, an oscillation frequency of a clock signal can be adjusted by changing an oscillator circuit of a clock source. However, the redesign of the circuit also increases the overall cost. Therefore, how to provide an accurate operating clock at low cost becomes an issue when designing a wireless interface.

SUMMARY

The disclosure provides a clock generation circuit and a clock adjustment method thereof, which may provide an accurate operation clock at low cost.

The clock generation circuit of the disclosure includes a fixed clock source, a variable clock source, a timing adjustment circuit and a pulse width signal generator. The fixed clock source generates a reference clock signal having a fixed frequency. The variable clock source receives a frequency setting signal to correspondingly generate an operational clock signal having a variable frequency. The timing adjustment circuit is coupled to the fixed clock source and the variable clock source to receive the reference clock signal and the operational clock signal, and determines whether a frequency of the operational clock signal is N times of a target frequency according to the reference clock signal. When the frequency of the operational clock signal is not N times of the target frequency, the changed frequency setting signal is provided to the variable clock source to change the frequency of the operational clock signal. When the frequency of the operational clock signal is N times of the target frequency, the frequency of the current operational clock signal is maintained, wherein N is an integer greater than 1. The pulse width signal generator is coupled to the variable clock source to receive the operational clock signal and divide the frequency of the operational clock signal to generate a pulse width modulation signal having the target frequency.

The clock adjustment method of the clock generation circuit according to the disclosure includes the following. A reference clock signal having a fixed frequency is received via a timing adjustment circuit. A operational clock signal having a variable frequency generated according to a frequency setting signal is received via the timing adjustment circuit. Whether a frequency of the operational clock signal is N times of a target frequency is determined according to the reference clock signal via the timing adjustment circuit, wherein N is an integer greater than one. When the frequency of the operational clock signal is not N times of the target frequency, the changed frequency setting signal is provided to a variable clock source via the timing adjustment circuit to change the frequency of the operational clock signal. When the frequency of the operational clock signal is N times of the target frequency, the current frequency setting signal is continuously provided to the variable clock source via the timing adjustment circuit to maintain the frequency of the operational clock signal. The frequency of the operational clock signal is divided via a pulse width signal generator to generate a pulse width modulation signal having the target frequency.

Based on the above, the clock generation circuit and the clock adjustment method thereof according to the embodiment of the disclosure determine whether the frequency of the operational clock signal having the variable frequency is N times of the target frequency according to the reference clock signal having fixed frequency. Also, when the frequency of the operational clock signal is N times of the target frequency, the frequency of the current operational clock signal is maintained to generate the pulse width modulation signal having the target frequency via a frequency division operation. Thereby, when the pulse width modulation signal having a desired frequency is generated via a low-cost variable clock, an accurate operation clock can be provided at low cost.

In order to make the features and advantages of the disclosure comprehensible, embodiments with reference to drawings are elaborated in detail below.

DESCRIPTION OF THE EMBODIMENTS

In an embodiment of the disclosure, a clock generation circuit can take a frequency of a higher frequency and a higher stability clock signal as a reference frequency via a timer. Also, it can compare with a frequency of a variable oscillator circuit, adjust an output frequency of the variable oscillator circuit to be an integer multiple of a target frequency (for example, a wireless charging frequency), and then divide the frequency to achieve a pulse width modulation signal of the target frequency that the final output meets.

Figure 1:
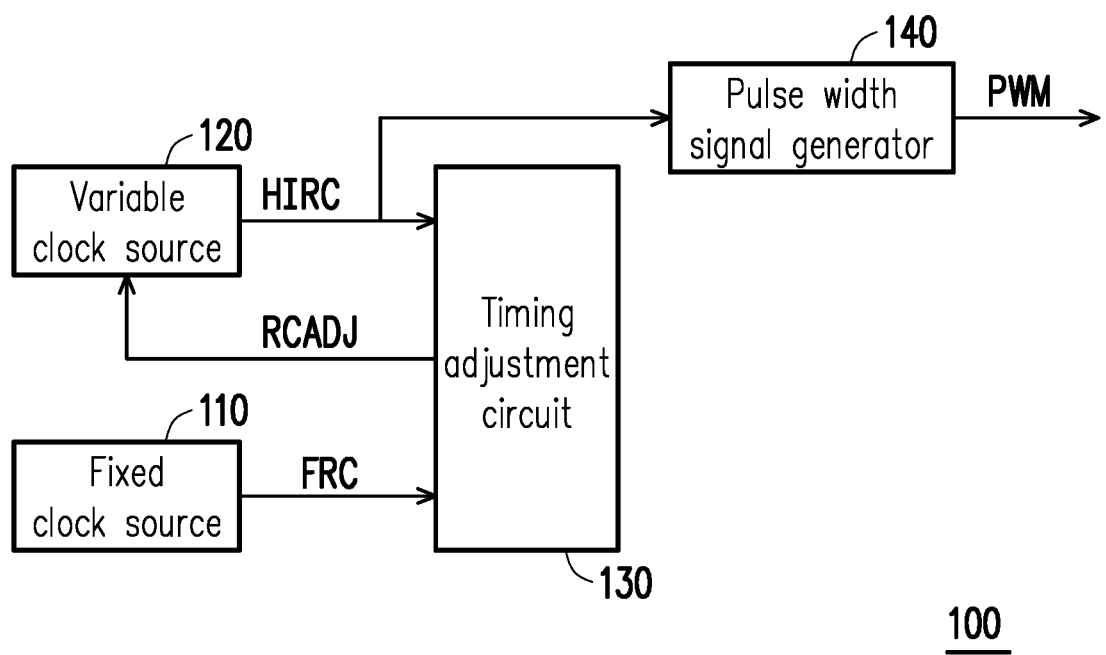
FIG. 1 is a schematic view of a system of a clock generation circuit according to an embodiment of the disclosure.

FIG. 1 is a schematic view of a system of the clock generation circuit according to an embodiment of the disclosure. With reference to FIG. 1, in the embodiment of the disclosure, a clock generation circuit 100 includes a fixed clock source 110, a variable clock source 120, a timing adjustment circuit 130, and a pulse width signal generator 140. The timing adjustment circuit 130 is coupled between the fixed clock source 110, the variable clock source 120 and the pulse width signal generator 140, and the variable clock source 120 is coupled to the pulse width signal generator 140.

The fixed clock source 110 includes, for example, a quartz oscillator, and is configured to generate a reference clock signal FRC having a fixed frequency. The variable clock source 120 includes, for example, at least one of an RC oscillator and a ring oscillator, and receives a frequency setting signal RCADJ to correspondingly generate an operational clock signal HIRC having a variable frequency. The timing adjustment circuit 130 receives the reference clock signal FRC and the operational clock signal HIRC, and determines whether the frequency of the operational clock signal HIRC is N times of the target frequency according to the reference clock signal FRC.

In other words, the timing adjustment circuit 130 can count the period of the operational clock signal HIRC according to the reference clock signal FRC to confirm the frequency of the operational clock signal HIRC. When the frequency of the operational clock signal HIRC is not N times of the target frequency, that is, the error between the variable frequency of the operational clock signal HIRC and the N times of the target frequency are greater than or equal to the corresponding allowable value. The timing adjustment circuit 130 provides a changed frequency setting signal RCADJ to the variable clock source 120 to change the frequency of the operational clock signal HIRC, wherein N is an integer greater than one. Moreover, when the frequency of the operational clock signal HIRC is not N times of the target frequency, the timing adjustment circuit 130 can continuously change the frequency setting signal RCADJ to continuously change the frequency of the operational clock signal HIRC, wherein the greater the N is, the greater the corresponding allowable value is.

When the frequency of the operational clock signal HIRC is N times of the target frequency, that is, when the error between the variable frequency of the operational clock signal HIRC and N times of the target frequency are less than the corresponding allowable value, the timing adjustment circuit 130 stops adjusting the variable frequency of the operational clock signal HIRC. At this time, the pulse width signal generator 140 receives the operational clock signal HIRC of N times of the target frequency, and divides the frequency of the operational clock signal HIRC to generate a pulse width modulation signal PWM having a target frequency.

In the embodiment of the disclosure, the fixed frequency of the reference clock signal FRC is higher than the target frequency while the variable frequency of the operational clock signal HIRC. Moreover, the variable frequency of the operational clock signal HIRC is between the target frequency and the fixed frequency of the reference clock signal FRC. The variable frequency of the operational clock signal HIRC can be divided into multiple levels to adjust. The adjustment of the variable frequency of the operational clock signal HIRC can be linear or non-linear, depending on the circuit design of the variable clock source 120.

In other words, in the embodiment of the disclosure, an initial value of the variable frequency of the operational clock signal HIRC can be set to be a minimum value of a variation scope of the variable frequency, and then be gradually increased. Alternatively, the initial value of the variable frequency of the operational clock signal HIRC can be set to be a maximum value of the variation scope of the variable frequency, and then be gradually decreased. Or, the initial value of the variable frequency of the operational clock signal HIRC can be set to be a frequency corresponding to any level of the variation scope of the variable frequency, and then be selectively adjusted upward or downward so that the variable frequency of the operational clock signal HIRC is sequentially set to be each of the multiple levels and is not repeated.

For example, after setting up the initial value, there may be a difference between each level of the operational clock signal HIRC and the expected one due to the variation of the process. Therefore, when adjusting the frequency, the adjustment of each level is not linear. Then, the frequency of the operational clock signal HIRC can be adjusted level by level by using the characteristics that each level is not linearly adjusted. In the process of adjustment, the frequency of the next-level operational clock signal HIRC can be calculated firstly after adjusted. For example, when setting as the frequency of the second-level operational clock signal HIRC, the reference clock signal FRC can be used (can have high accuracy but does not necessarily have a multiple of the target frequency) to estimate the frequency (that is, speed) of the operational clock signal HIRC.

Then, use the judgment formula ((FHIRC % FPWM)/FPWM)<±error ratio to estimate whether the difference between the operational clock signal HIRC and the N times of the target frequency is less than the corresponding allowable value. Among this, the FHIRC is the frequency of the operational clock signal HIRC, % is a remainder symbol, FPWM is the target frequency and the error ratio is the corresponding allowable value (in this case, the percentage is used as an example, but it can also be a numerical value). For example, FHIRC=420 kHz, FPWM=100 kHz, (FHIRC % FPWM)=20 kHz, ((FHIRC % FPWM)/FPWM)=(20 kHz/100 kHz).

If the percentage of 20 kHz/100 kHz is not less than the error ratio, it means that the frequency of the operational clock signal HIRC is not N times of the target frequency. A level can be adjusted (upward or downward) so that the frequency of the operational clock signal HIRC is changed. Then, calculate with the changed frequency, and see if it is a multiple of the target frequency. Conversely, if the percentage of 20 kHz/100 kHz is less than the error ratio, combine a clock divider or a comparator in internal design of the pulse width signal generator 140 to calculate a divided value (that is, frequency) to generate the pulse width modulation signal PWM having the target frequency.

According to the above, the fixed clock source 110 may include a high frequency and high stability oscillator circuit (for example, a quartz oscillator). The variable clock source 120 usually includes a relatively simple variable frequency oscillator circuit (for example, an RC oscillator or a ring oscillator), and the timing adjustment circuit 130 corrects the frequency of variable clock source 120 via the frequency of the fixed clock source 110 to generate the desired pulse width modulation signal PWM having the target frequency. Thereby, the pulse width modulation signal having the target frequency is provided at low cost.

Figure 2:
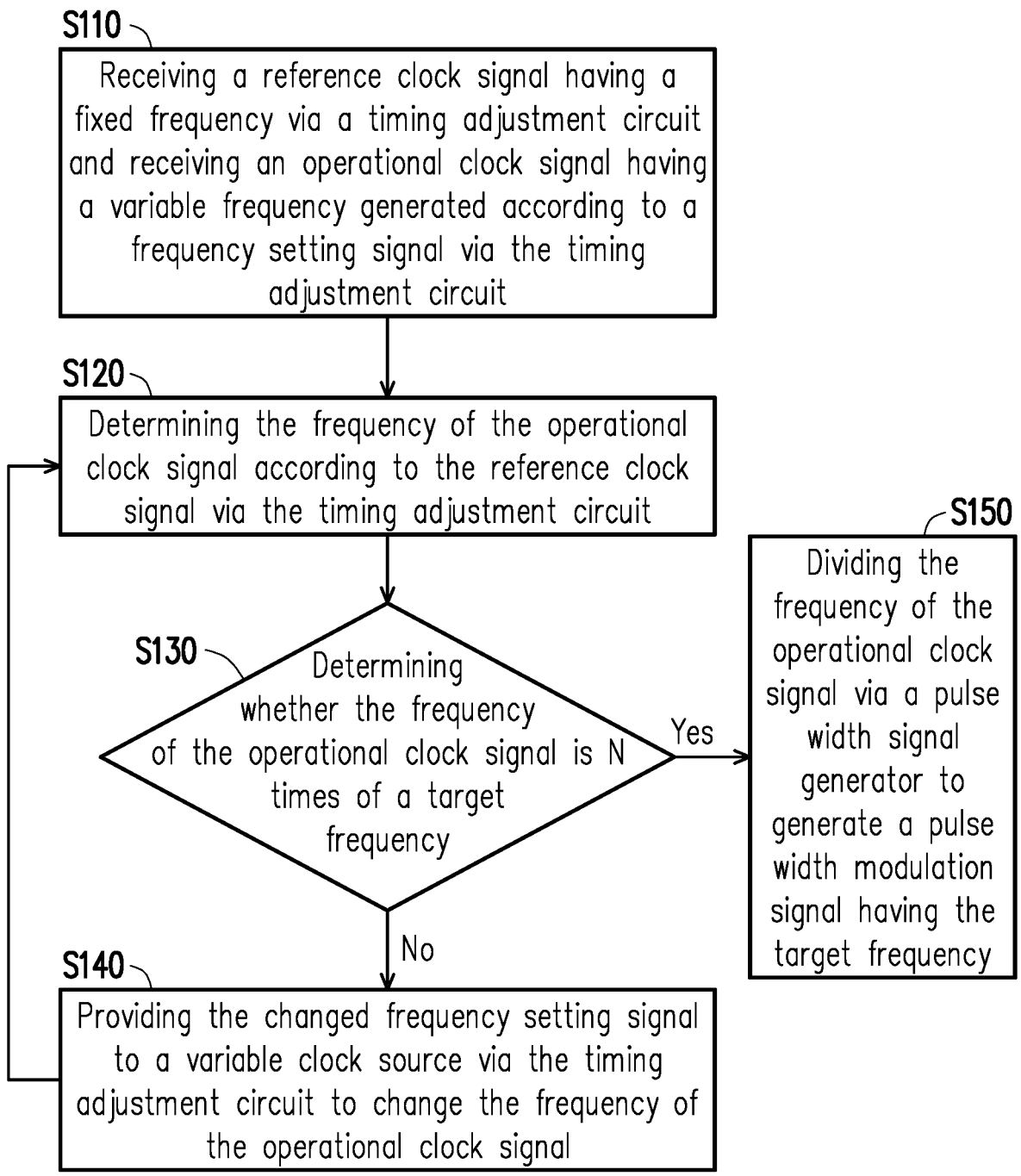
FIG. 2 is a flow chart of a clock adjustment method of the clock generation circuit according to an embodiment of the disclosure.

FIG. 2 is a flow chart of a clock adjustment method of the clock generation circuit according to an embodiment of the disclosure. With reference to FIG. 2, in the embodiment of the disclosure, the clock adjustment method of the clock generation circuit includes the following. In step S110, a reference clock signal having a fixed frequency is received via a timing adjustment circuit, and an operational clock signal having the variable frequency generated according to a frequency setting signal is received via the timing adjustment circuit. In step S120, the frequency of the operational clock signal is determined according to the reference clock signal via the timing adjustment circuit.

In step S130, whether the frequency of the operational clock signal is N times of the target frequency is determined, wherein N is an integer greater than one. When the frequency of the operational clock signal is not N times of the target frequency (that is, the determination result of step S130 is "No"), a changed frequency setting signal is provided to the variable clock source via the timing adjustment circuit to change the frequency of the operational clock signal (step S140). When the frequency of the operational clock signal is N times of the target frequency (that is, the determination result of step S130 is "Yes"), the current frequency setting signal is continuously provided to the variable clock source via the timing adjustment circuit to maintain the frequency of the operational clock signal. Also, the frequency of operational clock signal is divided to generate a pulse width modulation signal having the target frequency via the pulse width signal generator (step S150). The order of steps S110, S120, S130, S140 and S150 is for illustrative purposes, and the embodiment of the disclosure is not limited thereto. Moreover, for details of S110, S120, S130, S140 and S150, the description of the embodiments of FIG. 1 may be referred to, and explanation thereof is not repeated herein.

Based on the above, the clock generation circuit and the clock adjustment method thereof according to the embodiment of the disclosure determine whether the frequency of the operational clock signal having the variable frequency is N times of the target frequency according to the reference clock signal having fixed frequency. Also, when the frequency of the operational clock signal is N times of the target frequency, the frequency of the current operational clock signal is maintained to generate the pulse width modulation signal having the target frequency via the frequency division operation. Thereby, when the pulse width modulation signal having a desired frequency is generated via a low-cost variable clock, an accurate operation clock can be provided at low cost.

Although the disclosure has been elaborated with reference to the above embodiments, it will be apparent to the person of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A clock generation circuit, comprising:
   a fixed clock source generating a reference clock signal having a fixed frequency;
   a variable clock source receiving a frequency setting signal to correspondingly generate an operational clock signal having a variable frequency;
   a timing adjustment circuit coupled to the fixed clock source and the variable clock source to receive the reference clock signal and the operational clock signal, counting a time length of one or more periods of the operational clock signal based on the reference clock signal to determine whether a frequency of the operational clock signal is N times of a target frequency, providing the changed frequency setting signal to the variable clock source to change the frequency of the operational clock signal when the frequency of the operational clock signal is not N times of the target frequency, and maintaining a frequency of the current operational clock signal when the frequency of the operational clock signal is N times of the target frequency, wherein N is an integer greater than one; and
   a pulse width signal generator coupled to the variable clock source to receive the operational clock signal, and dividing the frequency of the operational clock signal to generate a pulse width modulation signal having the target frequency.

2. The clock generation circuit according to claim 1, wherein the fixed frequency is higher than the target frequency and the variable frequency.

3. The clock generation circuit according to claim 2, wherein the variable frequency is between the fixed frequency and the target frequency.

4. The clock generation circuit according to claim 1, wherein the timing adjustment circuit continuously changes the variable frequency when error between the variable frequency and N times of the target frequency are greater than or equal to a corresponding allowable value, and the timing adjustment circuit stops adjusting the variable frequency when error between the variable frequency and N times of the target frequency are less than a corresponding allowable value.

5. The clock generation circuit according to claim 4, wherein the greater the N is, the greater the corresponding allowable value is.

6. The clock generation circuit according to claim 1, wherein an initial value of the variable frequency is set to be a minimum value of a variation scope of the variable frequency.

7. The clock generation circuit according to claim 1, wherein an initial value of the variable frequency is set to be a maximum value of a variation scope of the variable frequency.

8. The clock generation circuit according to claim 1, wherein an initial value of the variable frequency is set to be a frequency corresponding to any level of a variation scope of the variable frequency.

9. The clock generation circuit according to claim 1, wherein the fixed clock source comprises a quartz oscillator.

10. The clock generation circuit according to claim 1, wherein the variable clock source comprises at least one of an RC oscillator and a ring oscillator.

11. A clock adjustment method of a clock generation circuit, comprising:
    receiving a reference clock signal having a fixed frequency via a timing adjustment circuit;
    receiving an operational clock signal having a variable frequency generated according to a frequency setting signal via the timing adjustment circuit;
    counting a time length of one or more periods of the operational clock signal based on the reference clock signal to determine whether a frequency of the operational clock signal is N times of a target frequency via the timing adjustment circuit, wherein N is an integer greater than one;
    when the frequency of the operational clock signal is not N times of the target frequency, providing the changed frequency setting signal to a variable clock source via the timing adjustment circuit to change the frequency of the operational clock signal;
    when the frequency of the operational clock signal is N times of the target frequency, continuously providing the current frequency setting signal to the variable clock source via the timing adjustment circuit to maintain the frequency of the operational clock signal; and
    dividing the frequency of the operational clock signal via a pulse width signal generator to generate a pulse width modulation signal having the target frequency.

12. The clock adjustment method according to claim 11, wherein the fixed frequency is higher than the target frequency and the variable frequency.

13. The clock adjustment method according to claim 12, wherein the variable frequency is between the fixed frequency and the target frequency.

14. The clock adjustment method according to claim 11, further comprising:
- when error between the variable frequency and N times of the target frequency are greater than or equal to a corresponding allowable value, continuously changing the variable frequency via the timing adjustment circuit; and
- when error between the variable frequency and N times of the target frequency are less than a corresponding allowable value, stopping adjusting the variable frequency via the timing adjustment circuit.

15. The clock adjustment method according to claim 14, wherein the greater the N is, the greater the corresponding allowable value is.

16. The clock adjustment method according to claim 11, wherein an initial value of the variable frequency is set to be a minimum value of a variation scope of the variable frequency.

17. The clock adjustment method according to claim 11, wherein an initial value of the variable frequency is set to be a maximum value of a variation scope of the variable frequency.

18. The clock adjustment method according to claim 11, wherein an initial value of the variable frequency is set to be a frequency corresponding to any level of a variation scope of the variable frequency.

* * * * *